US008325484B2

(12) United States Patent
Lo

(10) Patent No.: US 8,325,484 B2
(45) Date of Patent: Dec. 4, 2012

(54) HEAT-DISSIPATING APPARATUS AND ELECTRONIC DEVICE HAVING THE SAME

(75) Inventor: Kun-Hang Lo, Taipei Hsien (TW)

(73) Assignee: Aopen Inc., Taipei Hsien (TW)

( * ) Notice: Subject to any disclaimer, the term of this patent is extended or adjusted under 35 U.S.C. 154(b) by 259 days.

(21) Appl. No.: 12/926,353

(22) Filed: Nov. 12, 2010

(65) Prior Publication Data
US 2011/0228480 A1    Sep. 22, 2011

(30) Foreign Application Priority Data

Mar. 18, 2010 (TW) .............................. 99204760 U

(51) Int. Cl.
*H05K 7/20* (2006.01)
(52) U.S. Cl. ............. 361/704; 361/679.47; 361/679.48; 361/695; 361/719; 165/80.2; 165/80.3; 165/104.33
(58) Field of Classification Search ........................ None
See application file for complete search history.

(56) References Cited

U.S. PATENT DOCUMENTS

| 7,304,846 | B2 * | 12/2007 | Wang et al. | 361/700 |
| 7,414,850 | B2 * | 8/2008 | Hung | 361/719 |
| 8,050,038 | B2 * | 11/2011 | Chen et al. | 361/719 |
| 8,064,201 | B2 * | 11/2011 | Kuo et al. | 361/700 |
| 8,079,406 | B2 * | 12/2011 | Hung et al. | 165/104.33 |
| 8,085,539 | B2 * | 12/2011 | Yang | 361/700 |
| 8,085,542 | B2 * | 12/2011 | Yang | 361/719 |
| 2010/0307719 | A1 * | 12/2010 | Yang et al. | 165/104.26 |

FOREIGN PATENT DOCUMENTS

TW   M302059   12/2006

* cited by examiner

*Primary Examiner* — Boris Chervinsky
(74) *Attorney, Agent, or Firm* — Davidson Berquist Jackson & Gowdey, LLP

(57) ABSTRACT

A heat-dissipating apparatus is installed on a circuit board which includes a board body formed with a plurality of apertures, a heat-generating element, and a lock member having an engaging hole. The heat-dissipating apparatus includes a base plate and a plurality of fastening elements. The base plate is abutted against the heat-generating element, and includes an engaging hook for engaging the engaging hole, and a plurality of through holes corresponding in position to the apertures. A plurality of connecting elements are disposed below the board body and correspond in position to the apertures. Each fastening element extends through a respective through hole, and is engaged to a respective connecting element after extending through a respective aperture. A plurality of spring members are respectively sleeved on and bias the fastening elements to move away from the base plate.

10 Claims, 8 Drawing Sheets

HEAT-DISSIPATING APPARATUS AND ELECTRONIC DEVICE HAVING THE SAME

CROSS-REFERENCE TO RELATED APPLICATION

This application claims priority of Taiwanese Application No. 099204760, filed on Mar. 18, 2010.

BACKGROUND OF THE INVENTION

1. Field of the Invention

This invention relates to a heat-dissipating apparatus and an electronic device having the same, more particularly to a heat-dissipating apparatus that is assembled on a circuit board using a hook-engaging method and a screw-fastening method and an electronic device having the same.

2. Description of the Related Art

Referring to FIGS. 1 and 2, a heat-dissipating apparatus 1, as disclosed in Taiwanese Patent No. M302059, has a base plate 11 formed with a plurality of through holes 111. The heat-dissipating apparatus 1 includes a plurality of fastening elements 12, a plurality of spring elements 13, a plurality of connecting elements 14, and a plurality of elastic packing rings 15, all of which are similar to the through holes 111 in number. Each fastening element 12 extends through a respective through hole 111. Each spring element 13 is sleeved on a respective fastening element 12, and abuts against a top face of the base plate 11. Each packing ring 15 is sleeved on the respective fastening element 12 below the base plate 11.

To assemble the heat-dissipating apparatus 1 on a circuit board 2, the base plate 11 is disposed on and abuts against a heat-generating element 21 of the circuit board 2 such that the fastening elements 12 correspond in position to through holes 22 in the circuit board 2. Afterwards, each fastening element 12 is pressed and rotated to extend through the respective through hole 22 and engage with the respective connecting element 14, thereby fixing the heat-dissipating apparatus 1 to the circuit board 2. However, such a connecting method requires a worker to extend the fastening elements 12 one at a time through the respective through holes 22 to engage with the respective connecting elements 14 and thereby fix the heat-dissipating apparatus 1 to the circuit board 2. As a result, assembly is slow. Further, the fastening elements 12, the spring elements 13, the connecting elements 14, and the packing rings 15 used during assembly are numerous, resulting in an increase in production costs. Hence, the area of improvement that the present invention focuses on is that related to realizing a connecting and fixing method that can reduce the number of the fastening elements 12 and the elements used together therewith to thereby minimize the assembly time and production costs.

SUMMARY OF THE INVENTION

Therefore, a main object of the present invention is to provide a heat-dissipating apparatus that can be assembled on a circuit board using a hook-engaging method and a screw-fastening method, so that the production cost thereof and the assembly space and time can be minimized.

Another object of the present invention is to provide an electronic device having a heat-dissipating apparatus which can be assembled on a circuit board using a hook-engaging method and a screw-fastening method, so that the production cost thereof and the assembly space and time can be minimized.

The purpose of the present invention and the solution to the conventional technical problems are achieved through employment of the below technical means. According to one aspect of disclosure of the present invention, a heat-dissipating apparatus is installed on a circuit board. The circuit board includes a board body, a heat-generating element disposed on a top face of the board body, a plurality of apertures formed in the board body, and a lock member disposed on the top face of the board body and having an engaging hole opening in a front-rear direction. The heat-dissipating apparatus comprises a base plate, a plurality of connecting elements, a plurality of fastening elements, and a plurality of spring members. The base plate is abutted against the heat-generating element, and includes an engaging hook for engaging the engaging hole, and a plurality of through holes disposed above and corresponding in position to the apertures. The connecting elements are disposed below the board body of the circuit board and correspond in position to the apertures. Each fastening element extends through a respective one of the through holes, and is engaged to a respective connecting element after extending through a respective aperture. The spring members are respectively sleeved on and bias the fastening elements to move away from the base plate.

According to another aspect of disclosure of the present invention, an electronic device comprises a housing defining a receiving chamber, a circuit board, and a heat-dissipating apparatus. The circuit board is disposed in the receiving chamber, and includes a board body, a heat-generating element disposed on a top face of the board body, a plurality of apertures formed in the board body, and a lock member disposed on the top face of the board body and having an engaging hole opening in a front-rear direction. The heat-dissipating apparatus is disposed in the receiving chamber and is assembled on the circuit board. The heat-dissipating apparatus includes a base plate, a plurality of connecting elements, a plurality of fastening elements, and a plurality of spring members. The base plate abuts against the heat-generating element, and includes an engaging hook for engaging the engaging hole, and a plurality of through holes disposed above and corresponding in position to the apertures. The connecting elements are disposed below the board body of the circuit board, and correspond in position to the apertures. Each fastening element extends through a respective through hole and a respective aperture to engage with a respective connecting element. The spring members are respectively sleeved on and bias the fastening elements to move away from the base plate.

Through the aforesaid technical means, the advantages and effectiveness of the electronic device having a heat-dissipating apparatus according to the present invention reside in the fact that through the engageable configuration of the engaging hook of the base plate with the engaging hole of the lock member, the number of the fastening elements and the elements that are used together therewith can be reduced to thereby minimize the production costs, and the size of the base plate can be reduced to thereby minimize the assembly space required for installing the heat-dissipating apparatus in the receiving chamber. Further, a worker can quickly secure the heat-dissipating apparatus to the circuit board to thereby minimize the assembly time.

BRIEF DESCRIPTION OF THE DRAWINGS

Other features and advantages of the present invention will become apparent in the following detailed description of the preferred embodiment of the invention, with reference to the accompanying drawings, in which.

DETAILED DESCRIPTION OF THE PREFERRED EMBODIMENT

The above-mentioned and other technical contents, features, and effects of this invention will be clearly presented from the following detailed description of a preferred embodiment in coordination with the reference drawings. Through description of the concrete implementation method, the technical means employed and the effectiveness to achieve the predetermined purposes of the present invention will be thoroughly and concretely understood. However, the enclosed drawings are used for reference and description only, and are not used for limiting the present invention.

Figure 3:
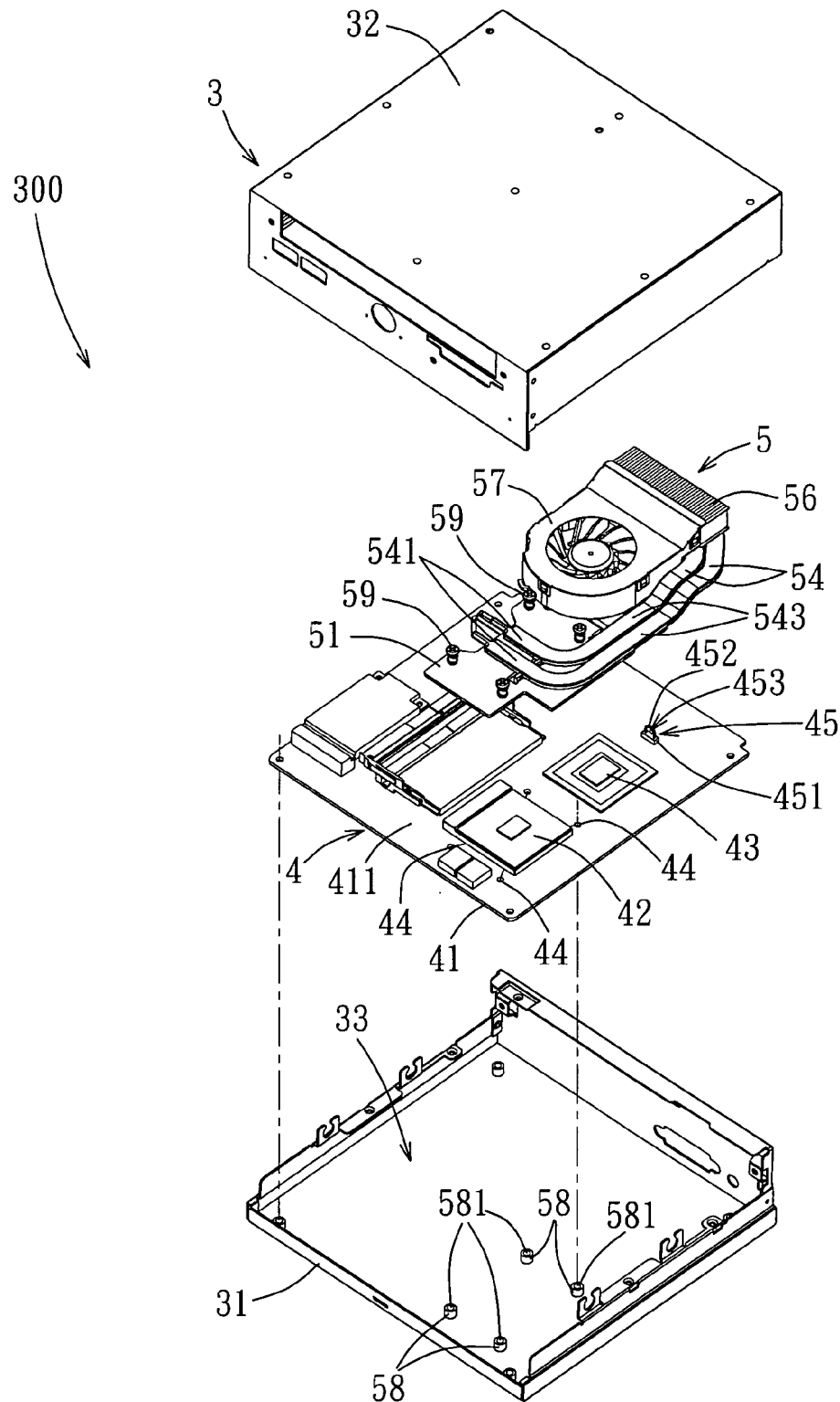
FIG. 3 is an exploded perspective view of an electronic device according to the preferred embodiment of the present invention, illustrating an assembly relationship among a housing, a circuit board, and a heat-dissipating apparatus.
Figure 4:
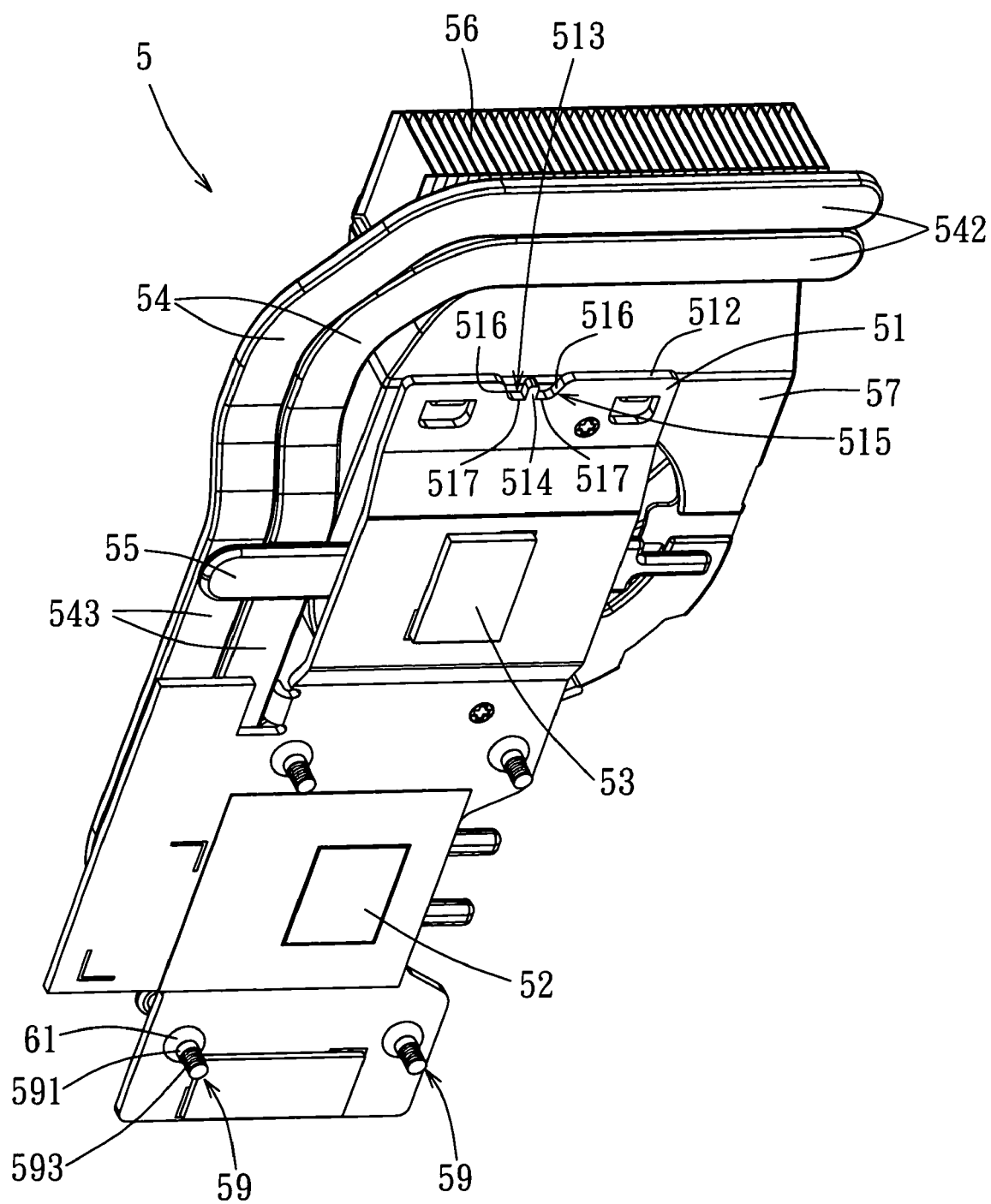
FIG. 4 is a bottom perspective view of the heat-dissipating apparatus of the preferred embodiment.
Figure 5:
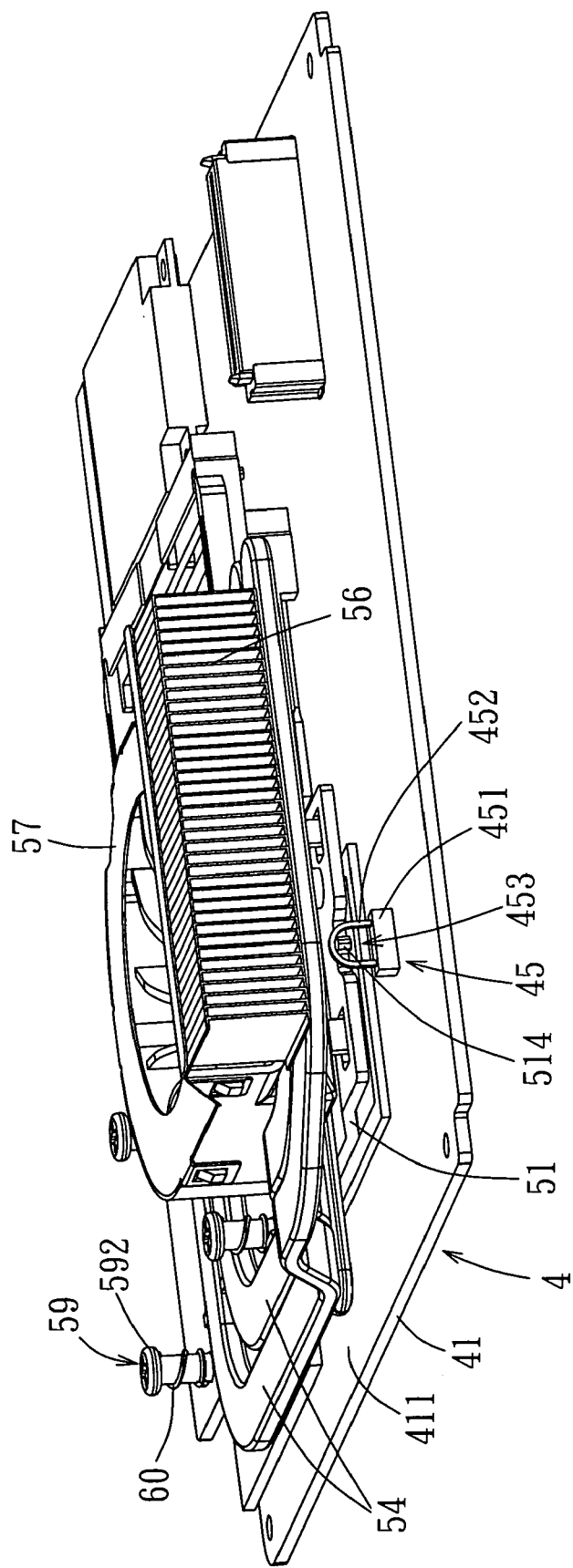
FIG. 5 is a perspective view of the heat-dissipating apparatus and the circuit board of the preferred embodiment, illustrating engagement of an engaging hook with an engaging hole.

Referring to FIG. 3, an electronic device 300 according to the preferred embodiment of the present invention comprises a housing 3, a circuit board 4, and a heat-dissipating apparatus 5. In this embodiment, the electronic device 300 is exemplified as a computer.

With reference to FIGS. 3 to 6, the housing 3 includes a lower housing part 31, and an upper housing part 32 connected to the lower housing part 31 using a screw-fastening method. The upper and lower housing parts 32, 31 cooperatively define a receiving chamber 33 for receiving therein the circuit board 4 and the heat-dissipating apparatus 5. The circuit board 4 is a motherboard, and includes a board body 41 having a top face 411, and two heat-generating elements 42, 43 provided on the top face 411 and spaced apart from each other in a front-rear direction. The heat-generating element 42 is disposed on a front side of the board body 41, and is configured as a central processor. The heat-generating element 43 is disposed on a rear side of the board body 41, and is configured as a chip.

The heat-dissipating apparatus 5 includes a base plate 51 made of copper which has good heat conduction. The base plate 51 has a heat-dissipating paste layer 52 coated on a bottom face thereof to contact with the heat-generating element 42, and a thermal pad 53 adhered to the bottom face thereof to contact with the heat-generating element 43. Through such a connection, heat generated by the heat-generating elements 42, 43 during operation of the same can be transmitted to the base plate 51 through the heat-dissipating paste layer 52 and the thermal pad 53, respectively. The heat-dissipating apparatus 5 further includes a plurality of substantially U-shaped first heat pipes 54, a second heat pipe 55, and a heat-dissipating fin unit 56. Each of the first heat pipes 54 has opposite front and rear arms 541, 542, and a bight section 543 between the front and rear arms 541, 542. The front arms 541 of the first heat pipes 54 are welded to the top face of the base plate 51 at a position corresponding to above the heat-dissipating paste layer 52. The rear arms 542 of the first heat pipes 54 extend outwardly of the rear end 512 of the base plate 51. The second heat pipe 55 is welded to and disposed between the top face of the base plate 51 and bottom faces of the bight sections 543 of the first heat pipes 54 at a position corresponding to above the thermal pad 53. The heat-dissipating fin unit 56 is disposed on top faces of the rear arms 542 of the first heat pipes 54. Through such a connection, heat generated by the heat-generating elements 42, 43 and transmitted to the base plate 51 can be quickly guided to the heat-dissipating fin unit 56 through the first and second heat pipes 54, 55. Further, through a heat-dissipating fan 57 that is disposed on the top face of the base plate 51 in proximity to a rear end 512 thereof and that provides heat-dissipating air flow to the heat-dissipating fin unit 56, heat from the heat-dissipating fin unit 56 can be forced outside of the housing 3, thereby achieving a good heat-dissipation effect.

Figure 6:
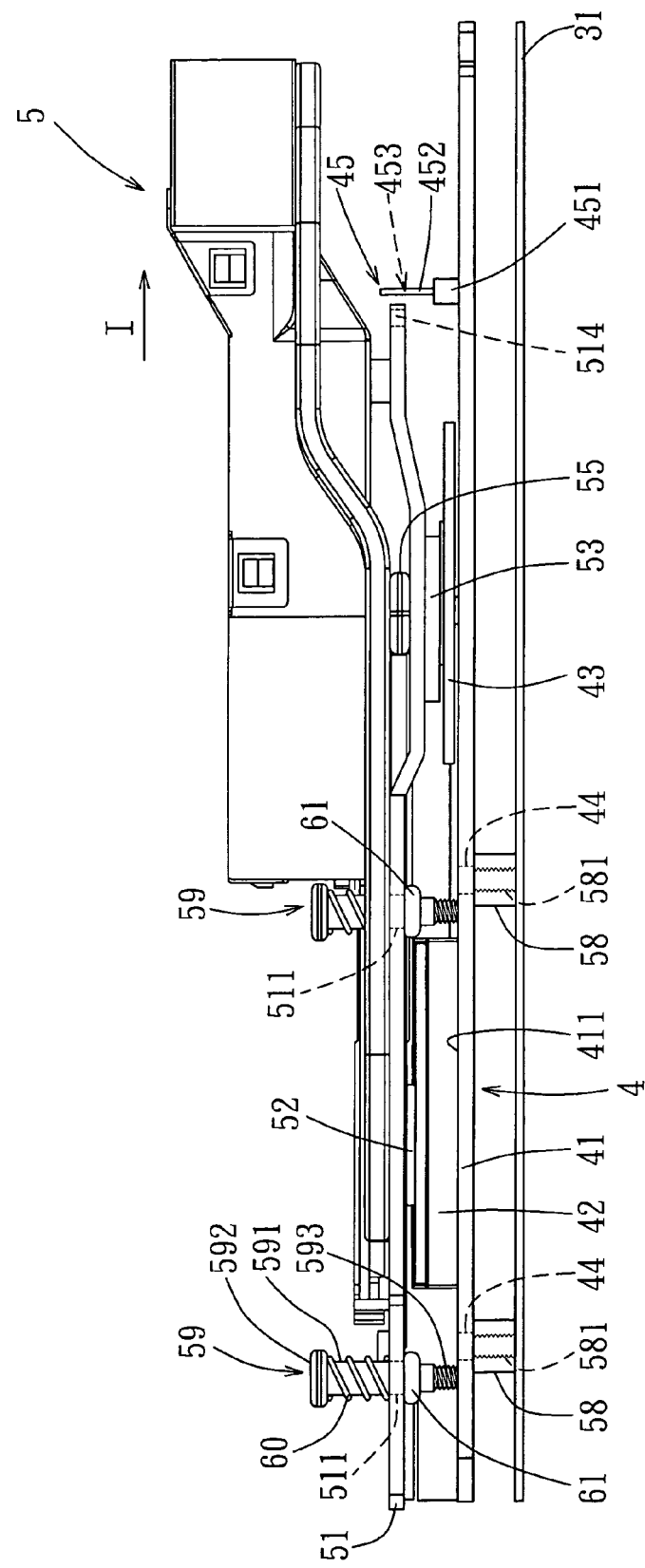
FIG. 6 is a schematic side view of the preferred embodiment in an assembled state, but without an upper housing part of the housing.

The circuit board 4 further includes a plurality of apertures 44 formed in the board body 41. The base plate 51 includes a plurality of through holes 511 (see FIG. 6) corresponding in position and in number to the apertures 44. The heat-dissipating apparatus 5 further includes a plurality of connecting elements 58, a plurality of fastening elements 59, and a plurality of spring members 60, all of which correspond in position and in number to the through holes 511 and the apertures 44. Each connecting element 58 is configured as a stud disposed on a top face of the lower housing part 31 and having a screw hole 581, and is disposed below a respective aperture 44. Each fastening element 59, as shown in FIG. 6, is configured as a screw including a non-threaded shank portion 591, a head portion 592 connected to a top end of and having a diameter larger than that of the non-threaded shank portion 591, and a threaded shank portion 593 connected to a bottom end of the non-threaded shank portion 591. The non-threaded shank portion 591 of each fastening element 59 extends through a respective through hole 511 in the base plate 51. The threaded shank portion 593 of each fastening element 59 extends through a respective aperture 44, and engages the screw hole 581 of a respective connecting element 58 so as to secure the base plate 51 of the heat-dissipating apparatus 5 to the circuit board 4.

Each spring member 60 is configured as a compression spring sleeved on the non-threaded shank portion 591 of the respective fastening element 59. Each spring member 60 has two opposite ends abutting respectively against the head portion 592 of the respective fastening element 59 and the top face of the base plate 51 so as to bias each fastening element 59 to move away from the base plate 51, so that the head portion 592 of each fastening element 59 is spaced apart from the base plate 51. When each fastening element 59 is pressed downwardly to extend the threaded shank portion 593 thereof through the respective aperture 44 and engage the screw hole 581 of the respective connecting element 58, each spring member 60 is compressed, and in turn, presses the base plate 51 downwardly. As a result, the heat-dissipating paste layer 52 and the thermal pad 53 can abut tightly and respectively against the heat-generating elements 42, 43. Preferably, the non-threaded shank portion 591 of each fastening element 59 is sleeved with an elastic packing ring 61 that abuts against a bottom face of the base plate 51. The packing ring 61 may be made of rubber or silicone to prevent removal of each fastening element 59 from the respective through hole 511 and to maintain the threaded shank portion 593 of each fastening element 59 below the base plate 51.

The circuit board 4 further includes a lock member 45 connected to the top face 411 of the board body 41 using a reflow soldering process. The lock member 45 includes a fixed seat 451 soldered to the top face 411 of the board body 41, and an inverted U-shaped ring portion 452 disposed on top of the fixed seat 451. The fixed seat 451 and the ring portion 452 cooperatively define an engaging hole 453 that opens in a front-rear direction. The base plate 51 further includes a receiving groove 513 extending inwardly from a rear end 512 thereof, and an engaging hook 514 disposed in the receiving groove 513. The engaging hook 514 is engaged to the engaging hole 453 of the lock member 45 in a front-rear direction, and abuts against an inner face of the ring portion 452 to prevent upward movement of the rear end 512 of the base plate 51. Further, the engaging hook 514 is disposed within the receiving groove 513 so as to prevent the engaging hook 514 from being bumped accidentally that will result in bending or breaking thereof. A groove wall 515 that defines the receiving groove 513 in the base plate 51 includes two spaced-apart guide slanting faces 516 disposed respectively on left and right sides of the engaging hook 514 and extending away from each other. Each guide slanting face 516 is abuttable against the ring portion 452 of the lock member 45 to guide the engaging hook 514 to move into the engaging hole 453. The groove wall 515 further includes two blocking faces 517 each disposed between and connected to the engaging hook 514 and a corresponding one of the guide slanting faces 516. The blocking faces 517 are abuttable against the ring portion 452 of the lock member 45, so that after the engaging hook 514 is inserted into the engaging hole 453, the base plate 51 is prevented from continuously moving rearwardly.

Figure 7:
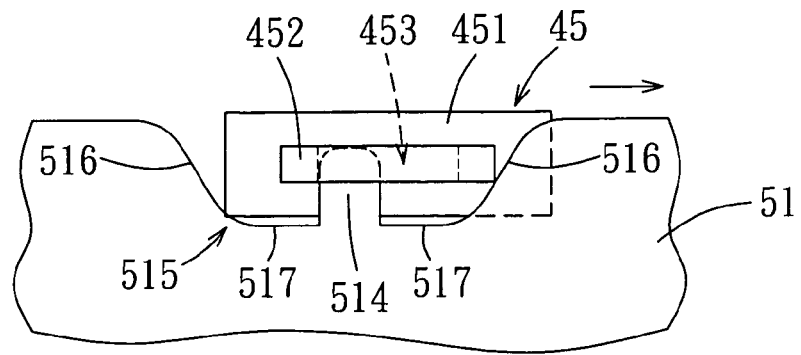
FIG. 7 is a fragmentary schematic view of the preferred embodiment, illustrating a ring portion of a lock member abutting against one of guide slanting faces of a groove wall.
Figure 8:
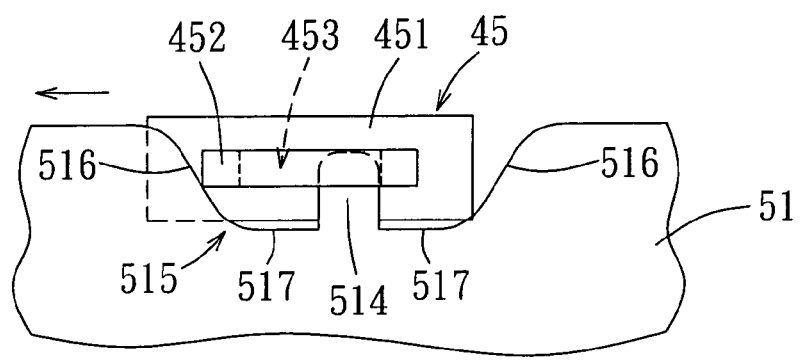
FIG. 8 is a view similar to FIG. 7, but illustrating the ring portion of the lock member abutting against the other guide slanting face of the groove wall.

With reference to FIGS. 6 to 8, to assemble the heat-dissipating apparatus 5 on the circuit board 4, the heat-dissipating apparatus 5 is first placed on the top face 411 of the board body 41 with the engaging hook 514 aligning with the engaging hole 453 of the lock member 45. Afterwards, the heat-dissipating apparatus 5 is moved rearwardly along the direction of an arrow (I). When one side of the ring portion 452 abuts against a corresponding one of the guide slanting faces 516, a sideward component of force applied by the ring portion 452 to the corresponding guide slanting face 516 urges the base plate 51 to move rightward along the direction of an arrow shown in FIG. 7 or leftward along the direction of an arrow shown in FIG. 8. Consequently, the engaging hook 514 can be guided accurately into the engaging hole 453 and can be prevented from bumping onto the ring portion 452 that may result in bending or breaking of either or both of the engaging hook 514 and the ring portion 452.

Figure 9:
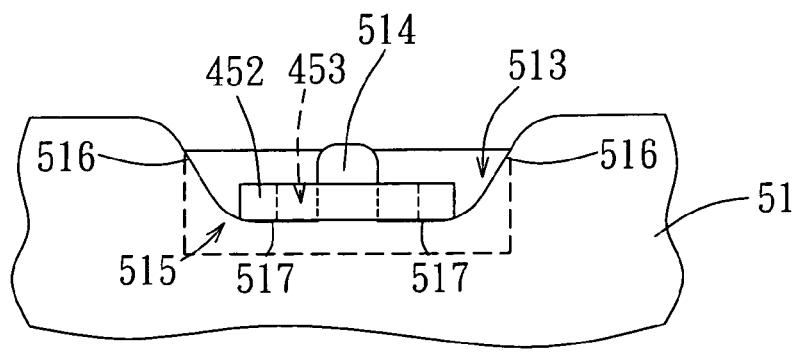
FIG. 9 is a view similar to FIG. 7, but illustrating the ring portion of the engaging ring abutting against blocking faces of the groove wall.
Figure 10:
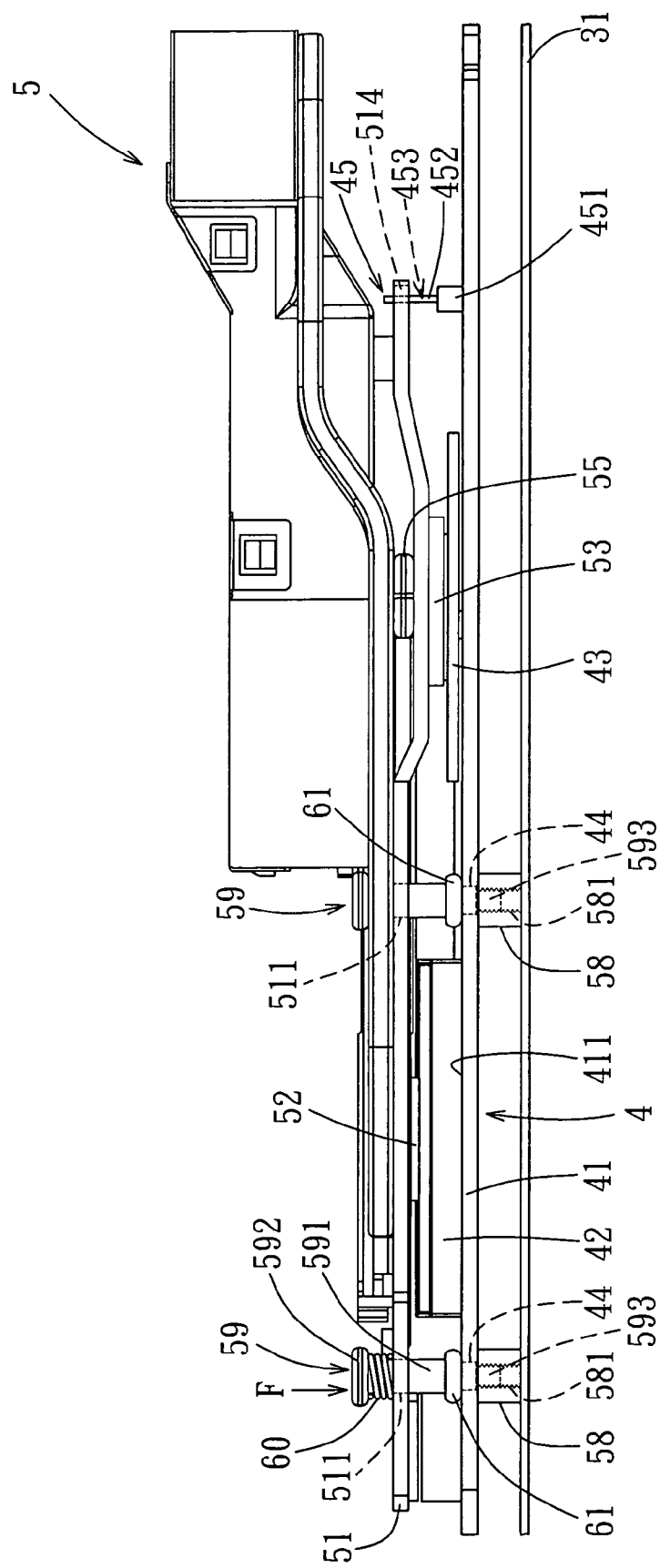
FIG. 10 is a view similar to FIG. 6, but illustrating the engaging hook engaged to the engaging hole, and each fastening element engaged to a screw hole in a respective connecting element.

With reference to FIGS. 9 and 10, when the ring portion 452 of the lock member 45 is received in the receiving groove 513 and abuts against the blocking faces 517, the base plate 51 is stopped from moving rearwardly. At this time, the heat-dissipating paste layer 52 and the thermal pad 53 are in position corresponding to the heat-generating elements 42, 43, and the threaded shank portions 593 of the fastening elements 59 are in position corresponding to the apertures 44. Afterwards, a worker can successively fasten each fastening element 59 by applying a downward pressure (F) on and simultaneously rotating the head portion 592 of each fastening element 59, so that the threaded shank portion 593 of each fastening element 59 can extend through the respective aperture 44 and engage the screw hole 581 in the respective connecting element 58. When the packing ring 61 abuts against the top face 411 of the board body 41, each fastening element 59 is stopped from moving downwardly. At this time, the heat-dissipating apparatus 5 is secured to the circuit board 4. Since each spring member 60 is compressed by the head portion 592 of the respective fastening element 59 during the fastening operation of each fastening element 59 so that each spring member 60 applies a downward pressure on the base plate 51, the engaging hook 514 at the rear end 512 of the base plate 51 will move upwardly and abut tightly against the inner face of the ring portion 452. As a consequence, the heat-dissipating apparatus 5 can be stably positioned on the circuit board 4, and the heat-dissipating paste layer 52 and the thermal pad 53 can press tightly and respectively against the heat-generating elements 42, 43.

On the other hand, when it is desired to remove the heat-dissipating apparatus 5 from the circuit board 4, each fastening element 59 is loosened so that the threaded shank portion 593 thereof is moved away from the screw hole 581 of the respective connecting element 58, after which the heat-dissipating apparatus 5 is moved forwardly along a direction opposite to the arrow (I) shown in FIG. 6. When the engaging hook 514 is separated from the engaging hole 453, the heat-dissipating apparatus 5 can be removed from the circuit board 4.

Figure 1:
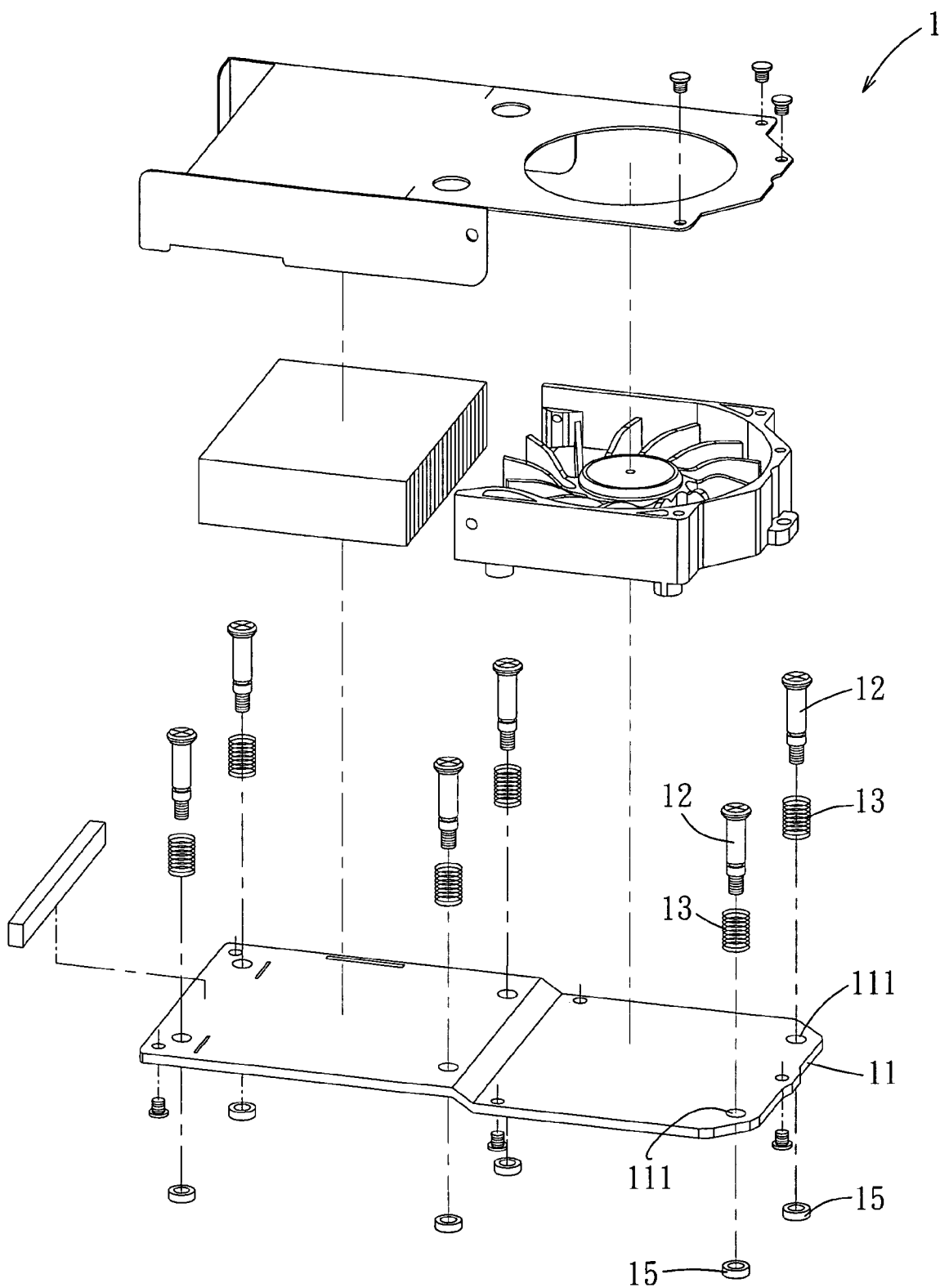
FIG. 1 is an exploded perspective view of a heat-dissipating apparatus disclosed in Taiwanese Patent No. M302059.
Figure 2:
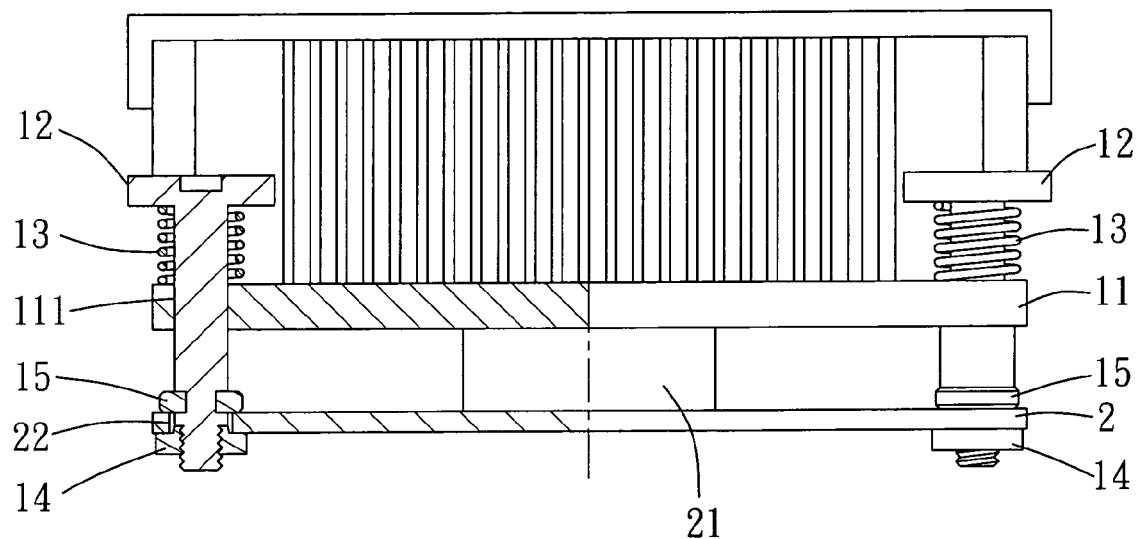
FIG. 2 is a partial sectional view of the heat-dissipating apparatus of FIG. 1.

In this embodiment, because of the configuration of the engaging hook 514 of the base plate 51 that is engageable with the engaging hole 453 of the lock member 45, the rear end 512 of the base plate 51 does not need the fastening elements 59 so as to be secured to the circuit board 4, unlike the conventional heat-dissipating apparatus 1 (see FIGS. 1 and 2), so that the number of the fastening elements 59 and the elements that are used together therewith, that is, the connecting elements 58, the spring members 60, and the packing rings 61, can be reduced to thereby minimize production costs. Further, the rear end 512 of the base plate 51 is configured not to protrude out of the rear arms 542 of the first heat pipes 54 so as to reduce the size of the base plate 51, thereby minimizing the space required for installing the heat-dissipating apparatus 5 in the receiving chamber 33. Moreover, after the engaging hook 514 is engaged to the engaging hole 453, the fastening operation of each fastening element 59 can be executed, so that the worker can quickly secure the heat-dissipating apparatus 5 to the circuit board 4, thereby minimizing the assembly time.

From the aforesaid description, the preferred embodiment of the electronic device 300, through the engageable configuration of the engaging hook 514 of the base plate 51 with the engaging hole 453 of the lock member 45, the number of the fastening elements 59 and the elements that are used together therewith, that is, the connecting elements 58, the spring members 60, and the packing rings 61, can be reduced to thereby minimize production costs. Further, the size of the base plate 51 is reduced, thereby minimizing the space required for installing the heat-dissipating apparatus 5 in the receiving chamber 33. Moreover, the worker can quickly secure the heat-dissipating apparatus 5 to the circuit board 4, thereby minimizing the assembly time. Therefore, the objects of the present invention can be realized.

While the present invention has been described in connection with what is considered the most practical and preferred embodiment, it is understood that this invention is not limited to the disclosed embodiment but is intended to cover various arrangements included within the spirit and scope of the broadest interpretations and equivalent arrangements.

I claim:

1. A heat-dissipating apparatus installed on a circuit board, the circuit board including a board body, a heat-generating element disposed on a top face of the board body, a plurality of apertures formed in the board body, and a lock member disposed on the top face of the board body and having an engaging hole opening in a front-rear direction, said heat-dissipating apparatus comprising:
   a base plate abutted against the heat-generating element and including an engaging hook for engaging the engaging hole, and a plurality of through holes disposed above and corresponding in position to the apertures;
   a plurality of connecting elements disposed below the board body of the circuit board and corresponding in position to the apertures;
   a plurality of fastening elements each extending through a respective one of said through holes, each of said fastening elements being engaged to a respective one of said connecting elements after extending through a respective one of the apertures; and
   a plurality of spring members respectively sleeved on and biasing said fastening elements to move away from said base plate.

2. The heat-dissipating apparatus of claim 1, wherein said base plate further includes two spaced-apart guide slanting faces disposed respectively on left and right sides of said engaging hook and extending away from each other, each of said guide slanting faces being adapted to abut against the lock member for guiding said engaging hook to move into the engaging hole.

3. The heat-dissipating apparatus of claim 1, wherein said base plate further includes a receiving groove that extends inwardly from a rear end of said board body for receiving the lock member, said engaging hook being disposed in said receiving groove.

4. The heat-dissipating apparatus of claim 3, wherein said receiving groove is defined by a groove wall which includes two spaced-apart guide slanting faces disposed respectively on left and right sides of said engaging hook and extending away from each other, each of said guide slanting faces being adapted to abut against the lock member for guiding said engaging hook to move into the engaging hole.

5. The heat-dissipating apparatus of claim 4, wherein said groove wall further includes two blocking faces each disposed between and connected to said engaging hook and a corresponding one of said guide slanting faces, said blocking faces being adapted to abut against the lock member to limit movement of said base plate.

6. An electronic device comprising:
a housing defining a receiving chamber;
a circuit board disposed in said receiving chamber and including a board body, a heat-generating element disposed on a top face of said board body, a plurality of apertures formed in said board body, and a lock member disposed on said top face of said board body and having an engaging hole opening in a front-rear direction; and
a heat-dissipating apparatus disposed in said receiving chamber and assembled on said circuit board, said heat-dissipating apparatus including
   a base plate abutting against said heat-generating element and including an engaging hook for engaging said engaging hole, and a plurality of through holes disposed above and corresponding in position to said apertures;
   a plurality of connecting elements disposed below said board body of said circuit board and corresponding in position to said apertures;
   a plurality of fastening elements each extending through a respective one of said through holes, each of said fastening elements extending through a respective one of said apertures to engage with a respective one of said connecting elements; and
   a plurality of spring members respectively sleeved on and biasing said fastening elements to move away from said base plate.

7. The electronic device of claim 6, wherein said base plate further includes two spaced-apart guide slanting faces disposed respectively on left and right sides of said engaging hook and extending away from each other, each of said guide slanting faces being abuttable against said lock member to guide said engaging hook to move into said engaging hole.

8. The electronic device of claim 6, wherein said base plate further includes a receiving groove that extends inwardly from a rear end of said board body for receiving said lock member, said engaging hook being disposed in said receiving groove.

9. The electronic device of claim 8, wherein said receiving groove is defined by a groove wall which includes two spaced-apart guide slanting faces disposed respectively on left and right sides of said engaging hook and extending away from each other, each of said guide slanting faces being abuttable against said lock member to guide said engaging hook to move into said engaging hole.

10. The electronic device of claim 9, wherein said groove wall further includes two blocking faces each connected between said engaging hook and a corresponding one of said guide slanting faces, said blocking faces being abuttable against said lock member to limit movement of said base plate.

* * * * *